(12) United States Patent
Guo et al.

(10) Patent No.: US 12,347,816 B2
(45) Date of Patent: Jul. 1, 2025

(54) INTEGRATED CIRCUIT PACKAGE WITH DECOUPLING CAPACITORS

(71) Applicant: Nvidia Corporation, Santa Clara, CA (US)

(72) Inventors: Naly Guo, Santa Clara, CA (US); Jerry Jia, Santa Clara, CA (US); Xiuzhuang Yang, Santa Clara, CA (US); Cindy Cui, Santa Clara, CA (US)

(73) Assignee: NVIDIA Corporation, Santa Clara, CA (US)

( * ) Notice: Subject to any disclaimer, the term of this patent is extended or adjusted under 35 U.S.C. 154(b) by 467 days.

(21) Appl. No.: 17/591,084

(22) Filed: Feb. 2, 2022

(65) Prior Publication Data

US 2022/0336430 A1    Oct. 20, 2022

(30) Foreign Application Priority Data

Apr. 16, 2021    (CN) .......................... 202110413801.0

(51) Int. Cl.
*H01L 25/16*    (2023.01)
*H01L 23/00*    (2006.01)
(Continued)

(52) U.S. Cl.
CPC ........ *H01L 25/16* (2013.01); *H01L 23/49827* (2013.01); *H01L 23/5385* (2013.01);
(Continued)

(58) Field of Classification Search
CPC .... H05K 1/0231; H05K 1/0257; H05K 1/141; H05K 1/181; H05K 3/368; H01L 23/13; H01L 23/642; H01L 23/49827; H01L 23/5385; H01L 23/49838; H01L 23/49816; H01L 23/50; H01L 23/3121; H01L 23/49811; H01L 25/16; H01L 25/0655; H01L 25/18; H01L 28/40; H01L 2924/19106; H01L 2924/19041; H01L 2924/15192; H01L 2924/15311; H01L 2924/19105; H01L 24/16; H10D 1/68
See application file for complete search history.

(56) References Cited

U.S. PATENT DOCUMENTS

6,222,246 B1 *  4/2001  Mak .................... H01L 23/50
                                                 257/E23.079
7,329,958 B1 *  2/2008  Shah ................... H01L 23/50
                                                      257/778
(Continued)

*Primary Examiner* — Victor A Mandala
*Assistant Examiner* — Lawrence C Tynes, Jr.

(57) ABSTRACT

IC package including a substrate having a first surface, a circuit die coupled to the first surface of the substrate, a decoupling capacitor coupled to the first surface of the substrate and a power trace coupled to the first surface of the substrate and connected to the circuit die and to the decoupling capacitor. A method of manufacturing an IC package include providing a substrate providing a substrate having a first surface, forming a power trace on the first surface of the substrate, mounting a circuit die on the first surface, where the circuit die is electrically connected to the power trace and mounting a decoupling capacitor on the first surface of the substrate, where the decoupling capacitor is electrically connected to the power trace and to the circuit die.

21 Claims, 6 Drawing Sheets

(51) Int. Cl.
*H01L 23/498* (2006.01)
*H01L 23/538* (2006.01)
*H10D 1/68* (2025.01)

(52) U.S. Cl.
CPC .............. *H01L 24/16* (2013.01); *H10D 1/68* (2025.01); *H01L 2224/16227* (2013.01); *H01L 2224/73265* (2013.01)

(56) References Cited

U.S. PATENT DOCUMENTS

| | | |
|---|---|---|
| 8,618,651 B1 | 12/2013 | Yee |
| 2020/0006303 A1* | 1/2020 | Akiba ............... H01L 23/49822 |
| 2020/0373260 A1* | 11/2020 | Hovis .................... H05K 1/141 |
| 2020/0373285 A1 | 11/2020 | Hovis et al. |
| 2021/0159166 A1* | 5/2021 | Oikawa ................ H05K 1/0253 |

* cited by examiner

INTEGRATED CIRCUIT PACKAGE WITH DECOUPLING CAPACITORS

CROSS-REFERENCE TO RELATED APPLICATION

This application claims priority to CN Patent Application No. 202110413801.0, entitled "INTEGRATED CIRCUIT PACKAGE WITH DECOUPLING CAPACITORS", filed Apr. 16, 2021. The above-listed application is commonly assigned with the present application is incorporated herein by reference as if reproduced herein in its entirety.

TECHNICAL FIELD

This application is directed, in general, to integrated circuit packages and methods of manufacturing thereof and in particular integrated circuit package that include decoupling capacitors.

BACKGROUND

A decoupling capacitor (decap) may be used to improve electrical performance of integrated circuit (IC) packages, e.g., to increase switching speeds by storing a charge from a $V_{in}$ power supply to sustain $V_{out}$ while a gate voltage has a power transistor turned off. Sometimes the decap is located on the bottom side of a substrate holding an integrated circuit die of the IC package.

SUMMARY

One aspect of the present disclosure provides an integrated circuit package. The integrated circuit package can include a substrate having a first surface, a circuit die coupled to the first surface of the substrate, a decoupling capacitor coupled to the first surface of the substrate and a power trace coupled to the first surface of the substrate and connected to the circuit die and to the decoupling capacitor.

In any such embodiments, the decoupling capacitor can have a conductive charge reservoir for the circuit die.

In any such embodiments, the power trace can be part of an electrically conductive power pathway that includes a through-substrate via passing through the substrate.

Any such embodiments can further include a first set of the decoupling capacitors wherein the power trace is electrically connected to each of the decoupling capacitors in the first set to form a first power island. Some such embodiments can further include a second set of the decoupling capacitors where a second power trace is electrically connected to each of the decoupling capacitors in the second set to form a second power island. For some such embodiments, the second power trace can be electrically connected to the electrically conductive power pathway by a second through-substrate via passing through the substrate For any such embodiments, the electrically conductive power pathway can include through substrate vias connected to the decoupling capacitors and passing though the substrate and connecting to microbumps located on a second surface of the substrate. In some such embodiments, the through-substrate vias passing through the substrate and connected to the decoupling capacitors are located in a perimeter portion of the substrate that is not covered by the circuit die on the first surface of the substrate.

Any such embodiments can further include a plurality of sets, of the decoupling capacitors wherein different ones of the power traces can be each electrically connected to the decoupling capacitors that are part of different ones of the plurality of the sets to form a plurality of power islands. For some such embodiments, the sets of decoupling capacitors can be distributed around the circuit die located on the first surface.

For any such embodiments, the circuit die covers a central portion of the first surface of the substrate.

Any such embodiments can further include a printed circuit board, wherein the printed circuit board includes a conductive power routing layer that is part of the electrically conductive power pathway. In some such embodiments, microbumps located on a second surface of the substrate can be electrically connected to the conductive power routing layer.

Any such embodiments can further include two or more the circuit dies located on the first surface, wherein: each of the circuit dies are connected to separate power islands, each of the separate power islands includes different sets of the decoupling capacitors and different power traces are electrically connected to the decoupling capacitors of the different sets. In some such embodiments, the separate power islands can be part of different electrically conductive power pathways.

Any such embodiments can further include a second type of decoupling capacitor, the second types decoupling capacitor mounted to the second surface of the substrate in an opening in the second surface of the substrate. In some such embodiments, a second power trace can be electrically connected to the circuit die and to the second type of decoupling capacitor. In some such embodiments the second type decoupling capacitor has a conductive charge reservoir for the circuit die and the second power trace can be part of the electrically conductive power pathway. In some such embodiments, a second power trace is electrically connected to a second one of the circuit die and to the second type of decoupling capacitor, whereby the second decoupling capacitor has a conductive charge reservoir for the second circuit die and the second power trace is part of a second electrically conductive power pathway.

Any such embodiments can further include one or more memory modules on the first surface of a substrate.

In another aspect, a method of manufacturing an integrated circuit package is disclosed. The method can include providing a substrate having a first surface and forming a power trace on the first surface of the substrate. The method can include mounting a circuit die on the first surface, where the circuit die is electrically connected to the power trace and mounting a decoupling capacitor on the first surface of the substrate, where the decoupling capacitor is electrically connected to the power trace and to the circuit die. Any such embodiments, can further include mounting a second type of decoupling capacitor on the second surface of the substrate in an opening in the second surface.

BRIEF DESCRIPTION

Reference is now made to the following descriptions taken in conjunction with the accompanying drawings, in which.

DETAILED DESCRIPTION

Embodiments of the disclosure follow from our recognition of several drawbacks from existing packages with decoupling capacitors placed on the backside of integrated circuit packages, and in particular, integrated circuit packages including high speed (high frequency) signaling circuit dies. When such a circuit die is mounted to a PCB, layers of the PCB located under the circuit die may be cut by multiple connections to through-circuit board vias (TCVs) to provide an electrically conductive power pathway to the backside mounted decoupling capacitor. Consequently, for high speed signaling, it may be difficult to provide an integrated reference (ground) plane in this area, which in turn may cause poor signal integrity. When there are multiple decoupling capacitors that are backside mounted, amount of space available for routing data signal lines under the circuit die (e.g., data carrying TCVs and traces to and from the circuit die) can become limited thereby limiting signaling speeds and through-put. The presence of backside mounted decoupling capacitors, power carrying TCVs and power carrying traces (power traces) to and from the decoupling capacitors also can introduce parasitic inductance and resistance, which in turn, can impact power decoupling and limit signaling speeds. The need to provide a large number of such power carrying TCVs in the PCB can increase PCB manufacturing costs and decrease PCB manufacturing yield rates. There can also be increased redesign costs associated with each new integrated circuit package project, e.g., to provide suitable numbers of decoupling capacitors, and associated power carrying TCVs and power traces, and balanced this with the need for suitable numbers of data signaling carrying TCVs and traces, even when the same circuit die design is used.

To help mitigate these drawbacks, we have developed an integrated circuit package where a decoupling capacitor can be mounted on the topside of the substrate holding an integrated circuit die. Power traces, also located on the topside of the substrate, connect, and in some embodiments interconnect, the decoupling capacitors with each other and with the circuit die. Locating at least some decoupling capacitors on the topside of the substrate helps free up space below the circuit die for data signal line connections, and, parasitic inductance and resistance can also be reduced. Embodiment of the circuit die and substrate can be mounted and connected to standardized trace design layout on the surface of a PCB design without the need to form TCVs in the PCB, thereby advantageously reducing design and manufacturing costs and increase manufacturing yield rates.

It would not have been obvious to locate decaps on the topside of the IC package substrate, such disclosed herein, at least because this would detract from much simpler traditional IC package manufacturing procedures. For instance, some traditional manufacturing procedures mount decaps on the backside of a PCB and then use vias to lead out to a chip power island to a system PCB. Such procedures are easier to implement than the procedures disclosed herein and can still provide adequate decoupling requirements for low speed applications (e.g., signaling speeds of 250 kHz, 500 kHz, 900 kHz or less). However our desire to use circuit dies capable of higher signaling speeds (e.g., signaling speeds of 1, 2, 3, 4, or 5 GHz or more in some embodiments) resulted in the drawbacks discussed above, and motivated us to change our IC package design and its manufacture as further disclosed below.

One aspect of the disclosure is an integrated circuit package. FIGS. 1-6 illustrate cross-sectional and plan views of various embodiments of the IC package 100 in accordance with the invention. With continuing reference to FIGS. 1-6, any of the IC package 100 embodiments includes a substrate 110 having a first surface (e.g., a top surface 105, or a bottom surface 155 with the substrate inverted as compared to the orientation shown in the figures), a circuit die 102 coupled to the first surface 105 of a substrate 110 (e.g., located on the top surface 105 or the bottom surface 155), a decoupling capacitor 112 coupled to the first surface of the substrate (e.g., located on the top or bottom surface of the substrate) and a power trace 115 coupled to the first surface of the substrate, and connected to the circuit die and to the decoupling capacitor (e.g., located on the top or bottom surface of the substrate).

The term circuit die, as used herein, refers to any of a central processing unit (CPU), a graphics processing unit (GPU), a memory chip, or other integrated circuit dies or chips as familiar to those skilled in the pertinent arts, or, combinations thereof.

In various embodiments, the decoupling capacitor 112 can have a conductive charge reservoir for the circuit die 102. In various embodiments, the power trace can be electrically connected to the circuit die and to the decoupling capacitor, and, the power trace can be part of an electrically conductive power pathway 120 connecting the decoupling capacitor and the circuit die 102. The electrically conductive power pathway 120 can connect the decoupling capacitor and the circuit die to an electrical power source (not shown). As non-limiting examples, the electrical power source can be one or more DC-DC converters deployed on package's PCB (e.g., PCB 305 FIG. 3), with each or the converters connected to provide electrical power via different power traces to the circuit die (e.g., die 102) or multiple circuit dies.

In some embodiments of the IC package 100, the electrically conductive power pathway 120 includes a through-substrate via (e.g., one or more TSVs 125a) passing through the substrate. In some such embodiments, power microbumps (e.g., microbumps 130, solder bumps) can connect the circuit die to the electrically conductive power carrying pathway, and, signal microbumps (e.g., microbumps 132, solder bumps) can connect the circuit die to electrically conductive signal carrying pathways (not shown).

Some embodiments of the IC package 100 can further include a first set of the decoupling capacitors 112 (e.g., set 140) and the power trace 115 can be electrically connected to each of the decoupling capacitors in the first set 140 to form a first power island (e.g., power island 142) and as part of the power trace 115. Some such embodiments can further include a second set (e.g., set 145) of the decoupling capacitors where a second power trace (e.g., power trace 147) can be electrically connected to each of the decoupling capacitors in the second set 145 to form a second power island (e.g., power island 150). Still further, in some such embodiments, the second power trace can be electrically connected to the electrically conductive power pathway 120 by a second through-substrate via (e.g., one or more TSVs 125b) passing through the substrate 110.

In some embodiments of the IC package 100, the electrically conductive power pathway 120 can include a TSV (e.g., generally TSVs 125) connected to the decoupling capacitors 112 and passing though the substrate 110 and connecting to microbumps (e.g., generally bottom side microbumps 152) located on a second surface (e.g., bottom surface 155 or top surface 105) of the substrate 110. For example, the electrically conductive power pathway 120 can include microbumps 152a, 152b which are connected to the TSVs 125a, 125b, respectively, and TSVs 125a, 125b can be connected to the decoupling capacitors 112 in the first and second sets of decoupling capacitors (e.g., decap sets 140, 145, respectively).

For some such embodiments, the through-substrate vias 125 passing through the substrate and connected to the decoupling capacitors can be located in a perimeter portion or portions (e.g., portions 160) of the substrate 110 that is not covered by the circuit die 102 on the first surface 105 of the substrate.

Figures 1, 3:
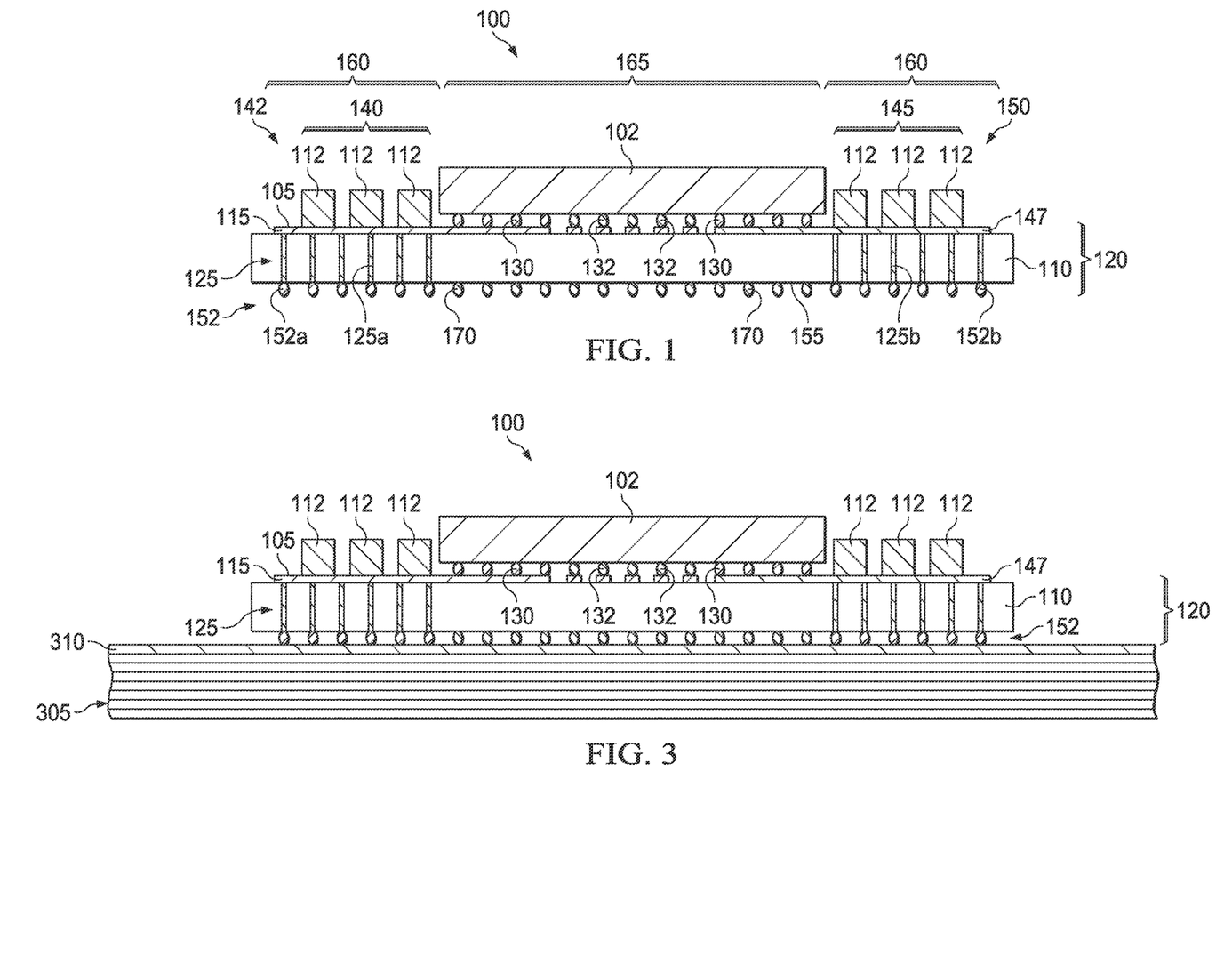
FIG. 1 presents a cross-sectional view of an example embodiment of the integrated circuit package of the disclosure including a top side decoupling capacitor.
FIG. 3 presents a cross-sectional view of another example embodiments of the integrated circuit package of the disclosure similar to the integrated circuit package depicted in FIG. 1, and further including a printed circuit board (PCB)

As illustrated in FIG. 1, some embodiments of the IC package 100 can further include a plurality of sets of the decoupling capacitors (e.g., sets 140, 145) and different ones of the power traces (e.g., traces 115, 147) can each be electrically connected to the decoupling capacitors 112 that are part of different ones of the plurality of the sets 140, 145 to form a plurality of power islands (e.g., power islands 142, 150).

Figure 2:
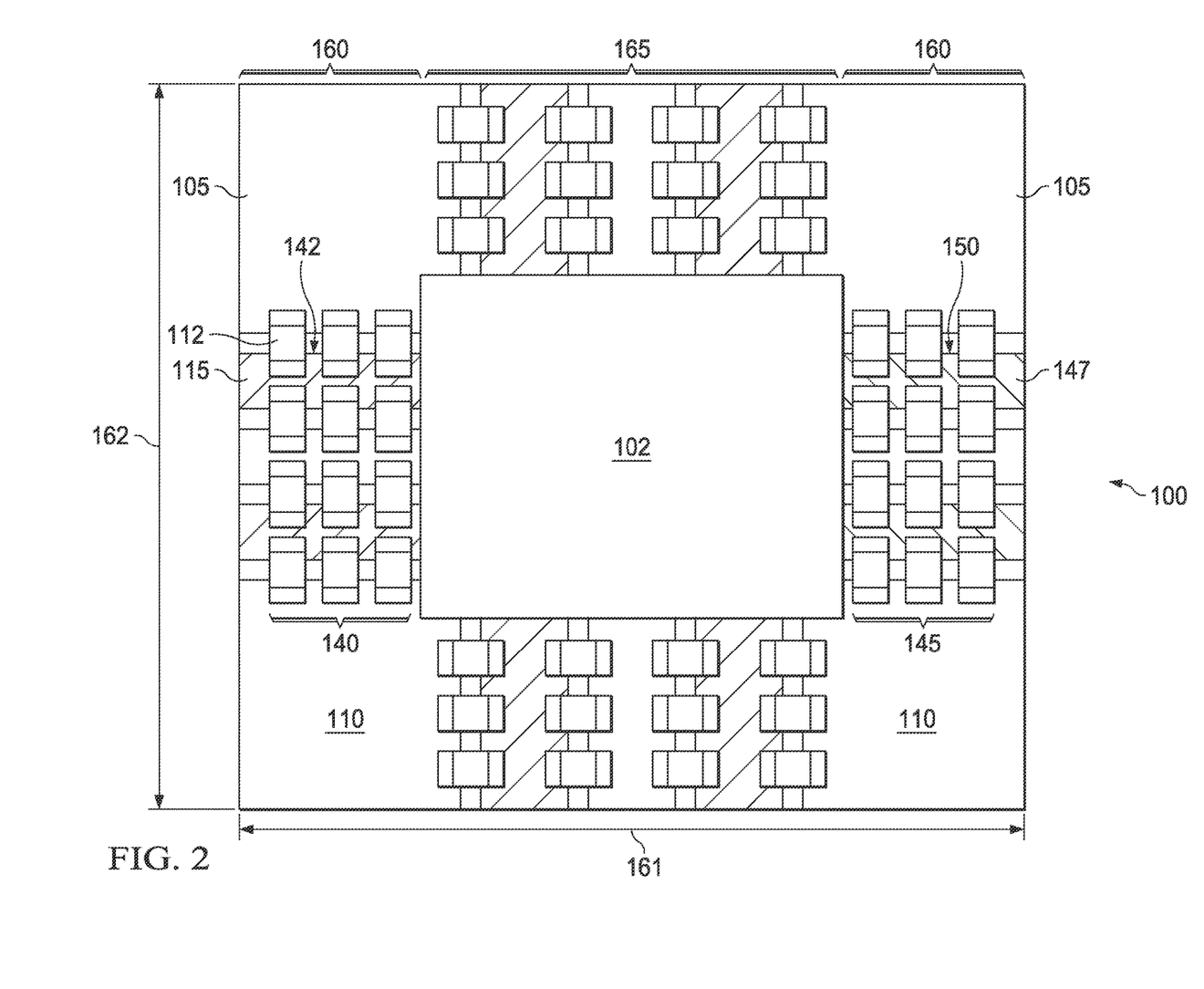
FIG. 2 presents a top down view of the integrated circuit package of the disclosure such as the integrated circuit package depicted in FIG. 1.

In some such embodiments, as illustrated in FIG. 2, the sets of decoupling capacitors (e.g., sets 140, 145) can be distributed around the circuit die 102 located on the first surface of the substrate 110. For instance, in some embodiments, the circuit die 102 can cover a central portion of the substrate 110, such that the die is not within a 5, 10, 20, or 30 percent distance from a perimeter relative to a total width 161 and/or height 162 dimension of the substrate 110 surface 105. For instance, in some embodiments, the perimeter portion or portions 160 that decoupling capacitors are located in can be within a 5, 10, 20, or 30 percent distance from the perimeter relative to a total width 161 and/or height 162 dimension of the substrate 110 surface 105.

As illustrated in FIG. 3, some embodiments of the IC package 100 can further include a printed circuit board (PCB 305), where the printed circuit board includes a conductive power routing layer (e.g., routing layer 310) that is part of the electrically conductive power pathway (e.g., power pathway 120).

For some such embodiments, microbumps (e.g., microbumps 152 located on a second surface (e.g., bottom surface 155 or top surface 105) of the substrate 110 can be electrically connected to the conductive power routing layer 310.

Figure 4:
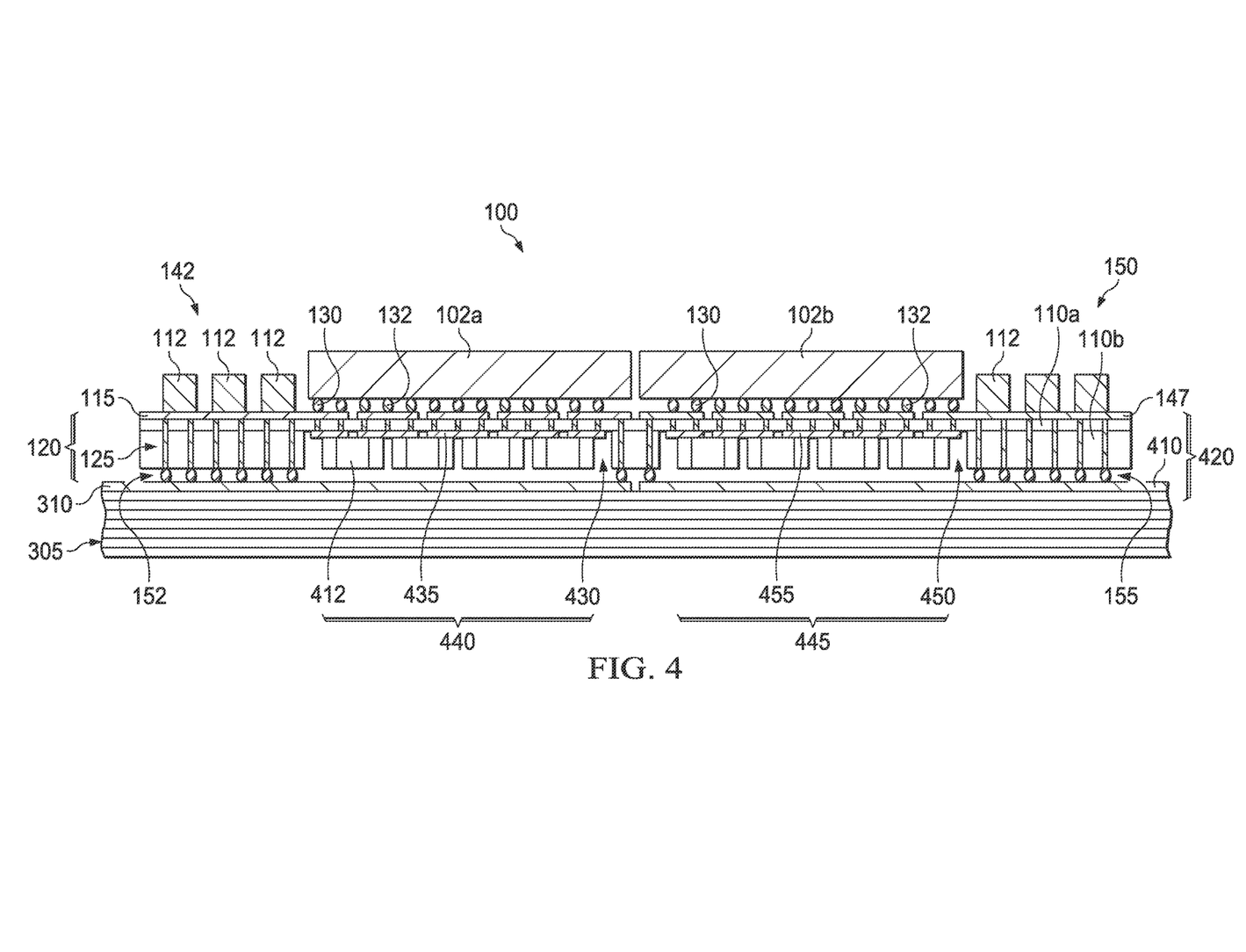
FIG. 4 presents a cross-sectional view of another example embodiments of the integrated circuit package of the disclosure similar to the integrated circuit package depicted in FIG. 3 and further including a bottom side decoupling capacitor.
Figure 5:
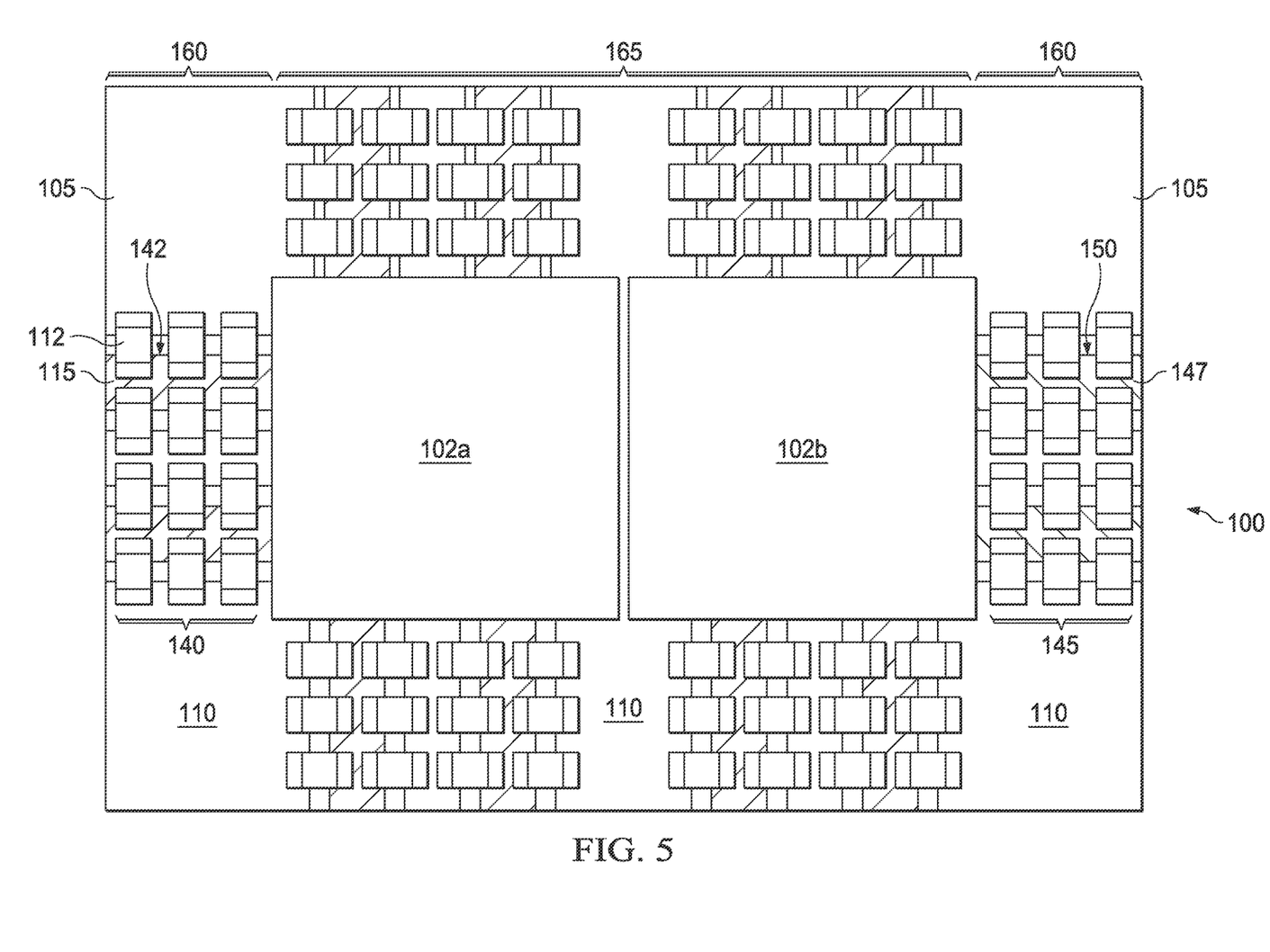
FIG. 5 presents a top down view of the integrated circuit package of the disclosure such as the integrated circuit package depicted in FIG. 4.

As illustrated in FIGS. 4 and 5, some embodiments of the IC package 100 can further include two or more the circuit dies (e.g., dies 102a, 102b) located on the first surface (e.g., top surface 105 or bottom surface 155) of the substrate 110.

For some such embodiments, each of the circuit dies can be connected to separate power islands (e.g., die 102a connected to power island 142, die 102b connected to power island 150) and each of the separate power islands can include different sets of the decoupling capacitors (e.g., sets 140 and 145, respectively) and different power traces (e.g., traces 115 and 147, respectively) can be electrically connected to the decoupling capacitors of the different sets (e.g., trace 115 connected to set 140, trace 147 connected to set 145). In some such embodiments, the separate power islands 142, 150 can be part of different electrically conductive power pathways (e.g., pathways 120, 420, separately connected to different power sources). In some such embodiments, the printed circuit board 305 can include separate conductive power routing layers (e.g., power routing layers 310 and 410) that are part of the different electrically conductive power pathways (e.g., power pathways 120, 420).

As illustrated in FIG. 4, some embodiments of the IC package 100 can further include a second type of decoupling capacitor (e.g., one or more second decaps 412), the second types decoupling capacitors can be mounted to the second surface of the substrate in an opening in the second surface of the substrate (e.g., each decap 412 mounted in one of openings 430, 450 in second surface 155 or in an analogous opening or openings made in the top surface 105).

For some such embodiments, a second power trace (e.g., trace 435) can be electrically connected to the circuit die (e.g., die 102a) and to the second type of decoupling capacitor 412. In some such embodiments, the second type of decoupling capacitor has a conductive charge reservoir for the circuit die 102a, and, the second power trace 435 is part of the electrically conductive power pathway 120. In some such embodiments the conductive charge reservoir for the circuit die 102a provided by the second type of decoupling capacitor or capacitors 412 can be greater than, less than, or the same as, the conductive charge reservoir for the circuit die 102a provided by the first type of decoupling capacitor or capacitors 112. In some embodiments, the first and second type of decoupling capacitors 112, 412 can both be of a same type (e.g., both ceramic or electrolytic capacitors) while in other embodiments the first and second type of decoupling capacitors 112, 412 can be of different types.

For some such embodiments, a second power trace 455 can be electrically connected to a second one of the circuit die (e.g., die 102b) and to the second type of decoupling capacitor 412, where the second decoupling capacitor has a conductive charge reservoir for the second circuit die 102b and the second power trace 455 is part of a second electrically conductive power pathway 420.

For example, when the IC package 100 includes two or more circuit dies (e.g., dies 102a, 102b), there can be different sets of the second types of decoupling capacitors 412 (e.g., sets 440 and 445, respectively) located in a same opening or in separate openings (e.g., openings 430 and/or 450, respectively) in the second surface (e.g., bottom surface 155 or top surface 105) of the substrate 110, and, separate power traces (e.g., first and second traces 435, 455, respectively) can electrically connect the second types of decoupling capacitors of the different sets (e.g., sets 440 and 445, respectively) to the two or more circuit dies (e.g., firs and second circuit dies 102a and 102b, respectively).

Figure 6:
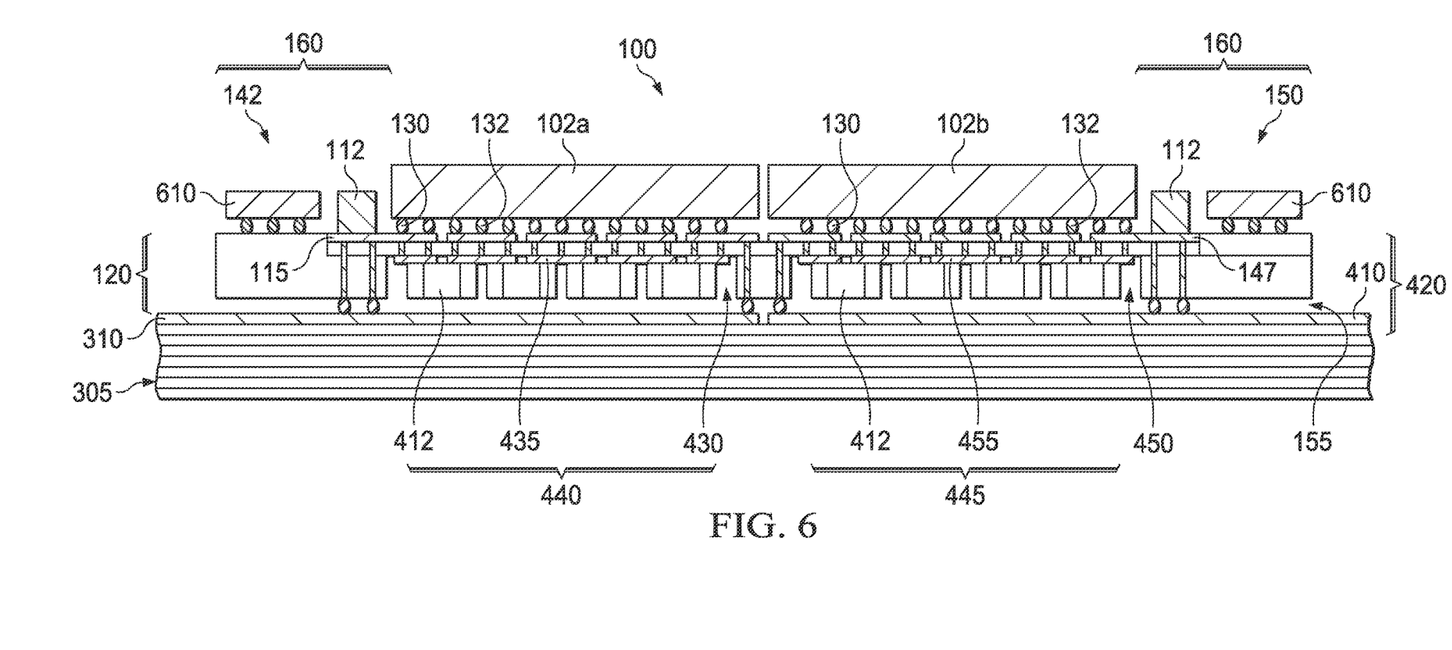
FIG. 6 presents a cross-sectional view of another example embodiments of the integrated circuit package of the disclosure similar to the integrated circuit package depicted in FIG. 4 and further including top side memory modules.

As illustrated in FIG. 6, some embodiments of the IC package 100 can further include one or more memory modules 610 on the first surface (e.g., top surface 105 or bottom surface 155) of the substrate 110. As a non-limiting example, the memory modules 610 can be or include double data rate dynamic random-access memory (DDR SDRAM), such as synchronous dynamic random-access memory (SDRAM) designed for GPU circuit dies (e.g., 102*a*, 102*b*). For instance, in some embodiments, by providing some decaps 412 on the back side of the substrate 110 and some decaps 112 on the first side of the substrate 110, an increased portion 160 of the first surface 105 can be made available for such memory modules. However, in some embodiments, the IC package 100 can have only top side mounted decaps 112 and no backside mounted decaps 412 and still accommodate such memory modules or other device features.

Figure 7:
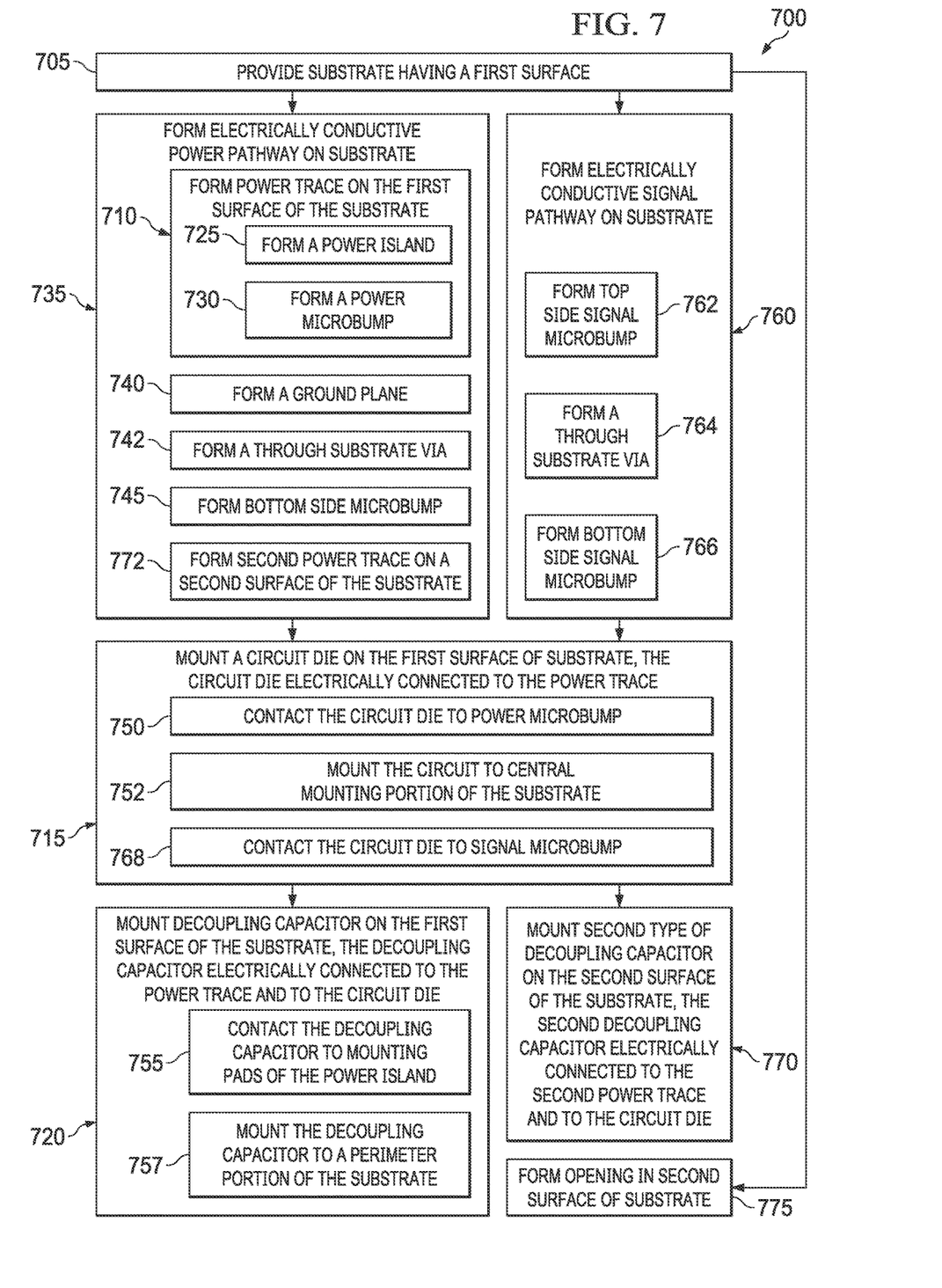
FIG. 7 presents a flow diagram of example embodiments of a method of manufacturing an integrated circuit package according to the principles of the disclosure, including any of the packages such as disclosed in the context of FIGS. 1-6.

Another aspect of the disclosure is a method of manufacturing an integrated circuit package. FIG. 7 illustrates by flow diagram selected steps in a method 700 of manufacturing the integrated circuit package of the discloser including the manufacture of any of the embodiments of the packages 100 discussed in the context of FIGS. 1-6.

With continuing reference to FIGS. 1-7 throughout, as illustrated in FIG. 7, embodiments of the method 700 can include providing a substrate having a first surface (e.g., step 705, substrate 110, a silicon substrate in some embodiments, on top surface 105 or bottom surface 155) and forming a power trace on a first surface of the substrate, (e.g., power trace 115, metallic traces in some embodiments, on top surface 105 or bottom surface 155). The method 700 can include mounting a circuit die on the first surface of the substrate 110, (e.g., step 715, one or more circuit dies 102*a*, 102*b* on top surface 105 or bottom surface 155) where the circuit die is electrically connected to the power trace. The method 700 can include mounting a decoupling capacitor on the first surface of the substrate, the decoupling capacitor electrically connected to the power trace and to the circuit dies (e.g., step 720, one or more decoupling capacitors 112, pre-fabricated ceramic and/or electrolytic capacitors in some embodiments).

In some embodiments, forming the power trace (step 710) on the first surface of the substrate can further include forming a power island (e.g., step 725, one or more power islands 142, 150) including forming mounting pads as part of the power island (step 727). In some embodiments forming the power trace (step 710) can further include forming a power microbump (e.g., step 730, one or more power microbumps 130) on the first surface of the substrate, the power microbump electrically connected to the power island (e.g., at least one of islands 142 or 150).

In some embodiments, the power trace can be part of an electrically conductive power pathway, e.g., in some embodiments of the method 700 forming the power trace (step 710) can be a step in forming an electrically conductive power pathway (e.g., step 735, power pathway 120). In some embodiments, forming the electrically conductive power pathway (step 735) can further include forming a ground plane (step 740) on the second surface of the substrate (e.g., bottom surface 155 or top surface 105 of substrate 110). In some embodiments, forming the electrically conductive power pathway (step 735) can further include forming a through substrate via (e.g., step 742, one or more TSVs 125, through silicon vias in some embodiments), the via can be electrically connected to the power island and to the ground plane. In some embodiments, forming the electrically conductive power pathway (step 735) can further include forming microbumps located on a second surface of the substrate wherein at least some of the bottom side microbumps are connected to the through substrate vias that are electrically connected to the power island (e.g., step 745 bottom side microbumps 152 connected to TSVs 125).

In some embodiments, mounting the circuit die (step 715) can include contacting the circuit die to a power microbump located on the first surface of the substrate, the power microbumps electrically connected to the power island (e.g., step 750, at least one power microbump 130 on first surface 105 of the substrate 110 and connected to at least one of islands 142 or 150). In some embodiments, mounting the circuit die (step 715) can include mounting the dies to a central circuit die mounting portion of the substrate (e.g., step 752, one or more dies 102*a*, 102*b* mounted to a central portion 165 of substrate 110).

In some embodiments, mounting the decoupling capacitor to the first surface of the substrate (step 720) includes contacting the decoupling capacitor to mounting pads of the power island (step 755, mounting one or more decaps 112 to one or more mounting pads pads of at least one of islands 142 or 150). In some embodiments, mounting the decoupling capacitor to the first surface of the substrate (step 720) includes mounting the decoupling capacitor to a perimeter portion of the substrate (e.g., step 757, mounting one or more decaps 112 to pad of at least one of islands 142 or 150 in a perimeter portion 160 of substrate 110).

Some embodiments of the method 700 can further include, e.g., as part of forming an electrically conductive signal pathway (step 760) forming signal microbumps on the first surface of the substrate (e.g., step 762, signal microbumps 132), the signal microbumps located on the circuit die mounting portion of the substrate 110 (e.g., portion 165) such that the signal microbumps are connected to signal TSVs formed in the substrate (step 764), and forming signal microbumps on the second surface of the substrate at least some of the bottom side signal microbumps can be formed (step 766, bottom side signal microbumps 170). The top and bottom side microbumps 132, 170 are connected so that data signals can be transmitted to and from the circuit die through the substrate once the circuit die is mounted in step 715 can contacted to the signal microbump (step 768, top side signal microbumps 132).

Embodiments of the method 700 can further include mounting a second type of decoupling capacitor (e.g., one or more decoupling capacitors 412, ceramic and/or electrolytic capacitors in some embodiments) on the second surface of the substrate in an opening in the second surface (step 770, bottom surface 155 or top surface 105 of substrate 110, at least one of openings 430, 450). For some such embodiments, the method 700 can include forming a second power trace on the second surface (e.g., step 772, power trace 435 on bottom surface 155 or top surface 105) such that the second power trace is electrically connected to the circuit die and to the second type of decoupling capacitor when the second type of decoupling capacitor is mounted (step 770) to thereby provide an additional conductive charge reservoir is provided to the circuit die. In some such embodiments, forming the second power trace (step 772) can include forming a second power island with mounting pads and mounting the second type of decoupling capacitor 412 to such mounting pads analogous to that discussed in the context of steps 725 and 755. Such embodiments can further include forming an opening in the second surface of the substrate (e.g., step 775, one or more openings 430, 450). Some embodiments of forming the opening (step 775) can include etching a surface of the substrate (e.g., bottom surface 155 or top surface 105 of a monolithic silicon substrate 110) using procedures familiar to those skilled in the pertinent arts. Some embodiments of forming the opening (step 775) can include providing a base substrate (e.g., step 705, FIG. 4*a*, providing base substrate 110*a*) and coupling an interposer substrate to the base substrate such that the opening is formed (e.g., coupling interposer substrate 110b).

Those skilled in the art to which this application relates will appreciate that other and further additions, deletions, substitutions and modifications may be made to the described embodiments.

What is claimed is:

1. An integrated circuit package, comprising:
   a substrate having a first surface;
   a circuit die coupled to the first surface of the substrate;
   a decoupling capacitor coupled to the first surface of the substrate;
   a power trace coupled to the first surface of the substrate and connected to the circuit die and to the decoupling capacitor; and
   a second type of decoupling capacitor, the second types decoupling capacitor mounted to the second surface of the substrate in an opening in a second surface of the substrate, wherein the decoupling capacitor is part of a first set of decoupling capacitors and the power trace is electrically connected to each of the decoupling capacitors in the first set to form a first power island.

2. The package of claim 1, wherein the power trace is part of an electrically conductive power pathway that includes a through-substrate via passing through the substrate.

3. The package of claim 1, further including a second set of the decoupling capacitors wherein a second power trace is electrically connected to each of the decoupling capacitors in the second set to form a second power island.

4. The package of claim 3, wherein the second power trace is electrically connected to an electrically conductive power pathway by a second through-substrate via passing through the substrate.

5. The package of claim 2, wherein the electrically conductive power pathway includes through substrate vias connected to the decoupling capacitor and passing though the substrate and connecting to microbumps located on the second surface of the substrate.

6. The package of claim 1, wherein the circuit die covers a central portion of the first surface of the substrate.

7. The package of claim 1, further including a printed circuit board, wherein the printed circuit board includes a conductive power routing layer that is part of the electrically conductive power pathway.

8. The package of claim 7, wherein microbumps located on a second surface of the substrate are electrically connected to the conductive power routing layer.

9. The package of claim 1, wherein a second power trace is electrically connected to the circuit die and to the second type of decoupling capacitor.

10. The package of claim 1, further including one or more memory modules on the first surface of a substrate.

11. An integrated circuit package, comprising:
    a substrate having a first surface;
    a circuit die coupled to the first surface of the substrate;
    a decoupling capacitor coupled to the first surface of the substrate;
    a power trace coupled to the first surface of the substrate and connected to the circuit die and to the decoupling capacitor; and
    a second type of decoupling capacitor, the second types decoupling capacitor mounted to the second surface of the substrate in an opening in a second surface of the substrate, wherein through-substrate vias passing through the substrate and connected to the decoupling capacitors are located in a perimeter portion of the substrate that is not covered by the circuit die on the first surface of the substrate.

12. The package of claim 11, further including one or more memory modules on the first surface of a substrate.

13. An integrated circuit package, comprising:
    a substrate having a first surface;
    a circuit die coupled to the first surface of the substrate;
    a decoupling capacitor coupled to the first surface of the substrate;
    a power trace coupled to the first surface of the substrate and connected to the circuit die and to the decoupling capacitor; and
    a second type of decoupling capacitor, the second types decoupling capacitor mounted to the second surface of the substrate in an opening in a second surface of the substrate,
    wherein the decoupling capacitor is part of one of a plurality of sets of decoupling capacitors wherein different ones of the power traces are each electrically connected to the decoupling capacitors that are part of different ones of the plurality of the sets to form a plurality of power islands.

14. The package of claim 13, wherein the sets of decoupling capacitors are distributed around the circuit die located on the first surface.

15. The package of claim 13, further including one or more memory modules on the first surface of a substrate.

16. An integrated circuit package, comprising:
    a substrate having a first surface;
    a circuit die coupled to the first surface of the substrate;
    a decoupling capacitor coupled to the first surface of the substrate;
    a power trace coupled to the first surface of the substrate and connected to the circuit die and to the decoupling capacitor; and
    a second type of decoupling capacitor, the second types decoupling capacitor mounted to the second surface of the substrate in an opening in a second surface of the substrate,
    wherein the circuit die is one of two or more circuit dies located on the first surface, wherein: each of the circuit dies are connected to separate power islands, each of the separate power islands includes different sets of the decoupling capacitors and different power traces are electrically connected to the decoupling capacitors of the different sets.

17. The package of claim 16, wherein the separate power islands are part of different electrically conductive power pathways.

18. The package of claim 16, further including one or more memory modules on the first surface of a substrate.

19. An integrated circuit package, comprising:
    a substrate having a first surface;
    a circuit die coupled to the first surface of the substrate;
    a decoupling capacitor coupled to the first surface of the substrate;
    a power trace coupled to the first surface of the substrate and connected to the circuit die and to the decoupling capacitor; and
    a second type of decoupling capacitor, the second types decoupling capacitor mounted to the second surface of the substrate in an opening in a second surface of the substrate,
    wherein a second power trace is electrically connected to a second one of the circuit die and to the second type of decoupling capacitor, whereby the second decoupling capacitor has a conductive charge reservoir for the second circuit die and the second power trace is part of a second electrically conductive power pathway.

20. The package of claim 19, further including one or more memory modules on the first surface of a substrate.

21. A method of manufacturing an integrated circuit package,
   providing a substrate having a first surface;
   forming a power trace on the first surface of the substrate;
   mounting a circuit die on the first surface, wherein the circuit die is electrically connected to the power trace;
   forming a through-substrate via passing through a perimeter portion of the substrate that is not covered by the circuit die on the first surface of the substrate;
   mounting a decoupling capacitor on the first surface of the substrate, wherein the decoupling capacitor is electrically connected to the power trace, the through-substrate via and to the circuit die, the decoupling capacitor is part of a first set of decoupling capacitors and the power trace is electrically connected to each of the decoupling capacitors in the first set to form a first power island; and
   mounting a second type of decoupling capacitor on a second surface of the substrate in an opening in the second surface.

* * * * *